United States Patent [19]
Breitbarth

[11] Patent Number: 5,986,584
[45] Date of Patent: *Nov. 16, 1999

[54] OPTICAL ENCODER BASED FADER DESIGN

[75] Inventor: Neal E. Breitbarth, San Francisco, Calif.

[73] Assignee: Avid Technology, Inc., Tewksbury, Mass.

[ * ] Notice: This patent is subject to a terminal disclaimer.

[21] Appl. No.: 09/024,801

[22] Filed: Feb. 17, 1998

Related U.S. Application Data

[63] Continuation of application No. 08/537,994, Oct. 2, 1995, Pat. No. 5,719,570.
[51] Int. Cl.$^6$ ....................................................... H03M 1/22
[52] U.S. Cl. .................................................................. 341/13
[58] Field of Search ................................... 341/13, 1, 5, 14

[56] References Cited

U.S. PATENT DOCUMENTS 5,719,570  2/1998  Breitbarth ................................. 341/13

*Primary Examiner*—Brian Young
*Attorney, Agent, or Firm*—Fish & Neave; Jeffrey H. Ingerman

[57] ABSTRACT

An apparatus indicating the position of an adjustable lever, such as a control lever in a digital audio console, is described. A frame member constrains movement of the adjustable lever. The lever is operatively connected to an encoder apparatus, such that movement of the lever causes movement of the encoder apparatus to provide an indication of position of the lever within the frame member.

20 Claims, 1 Drawing Sheet

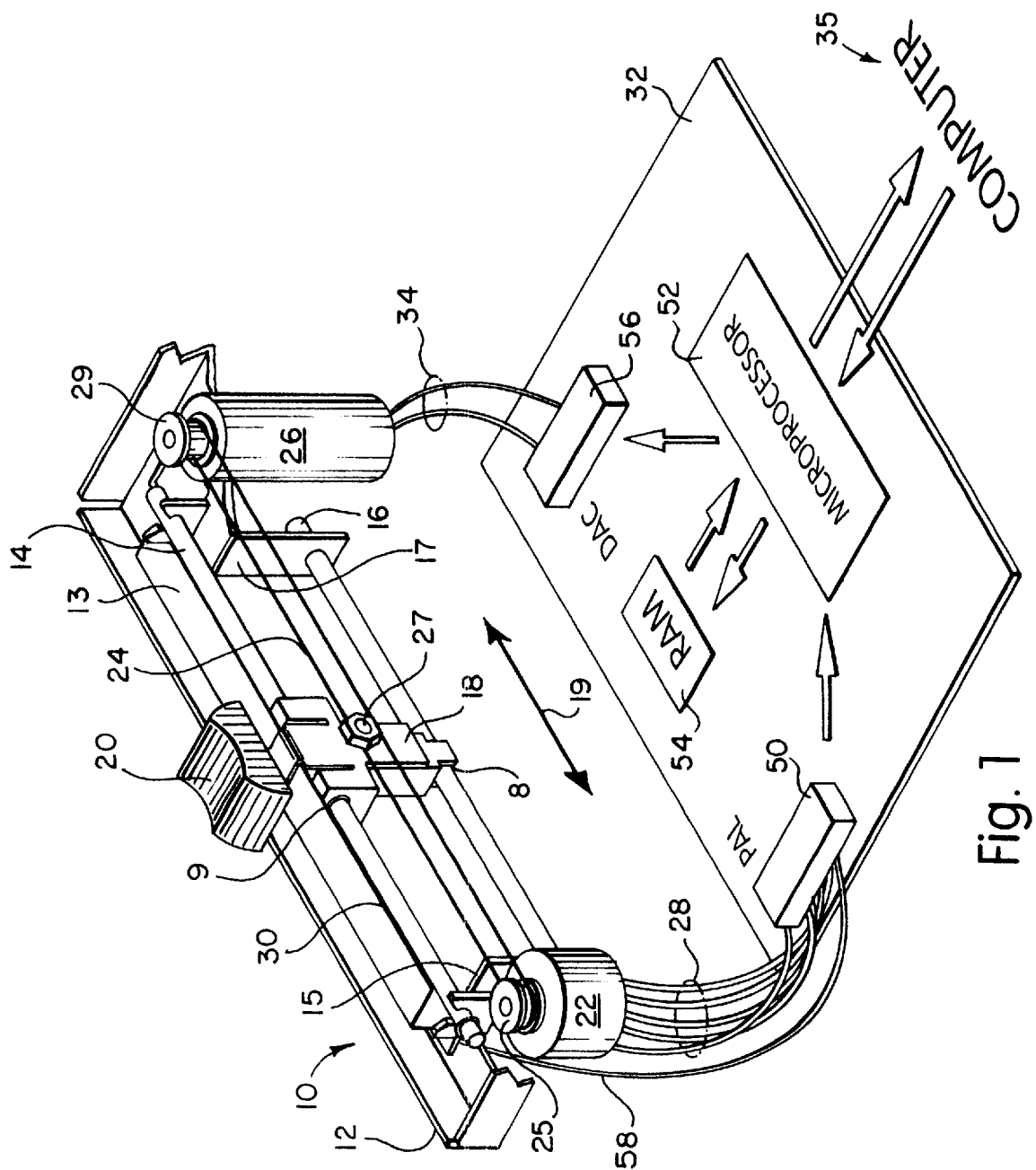

OPTICAL ENCODER BASED FADER DESIGN

This application is a continuation under 37 CFR §1.53(b) of prior application Ser. No. 08/537,994, incorporated herein by reference, which was filed on Oct. 2, 1995 and issued as U.S. Pat. No. 5,719,570 on Feb. 17, 1998.

FIELD OF THE INVENTION

This invention relates to digitally-based apparatus for indicating the position of a adjustable member, such as a fader control lever, which may be used in an apparatus to control the gain or other parameter of an audio or other signal.

BACKGROUND OF THE INVENTION

Audio faders are well-known in the prior art and are used to adjust the gain of one or more audio signals in the production of a recording of a sequence of audio events. A common prior art apparatus for controlling the gain of the audio signal includes a movable control lever, slider or knob (collectively referred to hereinafter as a "lever") which is connected to a linear potentiometer. Movement of the lever, usually in a one-dimensional, linear movement, changes the electrical characteristics of the potentiometer. The potentiometer is electrically connected by well known techniques across a voltage supply having a magnitude representing the range over which it is desired to vary the control signal applied to the control input of an associated voltage controlled amplifier (VCA), also well known in the prior art.

Generally, in this type of prior art device, the potentiometer has its wiper arm connected directly to a fader control lever in order to vary a parameter such as the gain of an audio signal. In use, the operator manually adjusts the position of the lever which is coupled to the wiper arm of the potentiometer. This action adjusts the control voltage applied to the gain control input of the voltage controlled amplifier. Such a prior art analog potentiometer system is described in U.S. Pat. No. 4,429,219, issued Jan. 31, 1984 to Yochum et al. A problem associated with prior art mechanically-based potentiometers, according to the description given in the Yochum et al. patent (col. 3, lines 15–23), is that rubbing of the lever's wiper arm within the linear potentiometer causes the mechanical assembly to wear, and this in turn introduces noise into the gain control signal provided at the wiper arm. The noise produced by the potentiometer is combined with the audio signal entering the voltage-controlled amplifier. Consequently, the gain control operation introduces an undesired noise component into the audio signal, causing audio signal inaccuracies and distortions.

Today, a transition from analog-based audio processing consoles to digital-based consoles for audio mixing and recording applications is occurring. Accordingly, in order to use the prior art analog potentiometer type of fader control discussed above, analog to digital converters are necessary to convert the analog position signal from the potentiometer and its related lever to a digital signal, thus adding more circuitry and adding a potential for further errors and noise in the system.

Therefore, it is desirable to utilize in digital-based audio consoles a digitally-based audio fader system. The Yochum et al. patent described above, as well as U.S. Pat. No. 4,412,182 issued Oct. 25, 1983 to Yochum, disclose audio fader systems which do not rely on mechanical contact between the elements for establishing the position detection operation. Instead, a shutter and light beam arrangement is employed which is described in the Yochum et al. patent (col. 4, lines 50–57) as being essentially immune to the wear problems associated with the prior art analog potentiometer system. Furthermore, the bulk of the signal processing may be accomplished with digital circuitry permitting, according to the Yochum et al. patent, low noise operation. In the Yochum et al. patent, a number of light emitting diodes or light sources are interfaced with a shutter-like device or other obturator and a photo-sensitive detector. As disclosed in the Yochum et al. patent, there are 13 emitter/detector pairs and thus 13 signals whose values collectively identify the location of the shutter over the range of 66 possible positions (col. 7, lines 6–18). The shutter is connected directly to a manually movable lever.

The prior art also includes a rotatable fader knob attached directly to the shaft of an optical encoder, such that rotation of the knob rotates the optical encoder shaft, which, with appropriate circuitry, controls the gain, for example, of an audio signal.

Other light-based position or channel detection and selection apparatus is shown in the following U.S. Pat. No. : 4,015,253 issued Mar. 29, 1977 to Goldstein; U.S. Pat. No. 4,137,451 issued Jan. 30, 1979 to Einolf; U.S. Pat. No. 4,122,395 issued Oct. 24, 1978 to Schotz et al.; U.S. Pat. No. 3,835,384 issued Sep. 10, 1974 to Liff; U.S. Pat. No. 3,755,681 issued Aug. 28, 1973 to Montross; U.S. Pat. No. 3,381,288 issued Apr. 30, 1968 to Van Vlodrop; U.S. Pat. No. 3,619,626 issued Nov. 9, 1971 to Rudolph; U.S. Pat. No. 4,573,110 issued Feb. 25, 1986 to Drumm; and U.S. Pat. No. 3,363,106 issued Jan. 9, 1968 to Park.

The apparatus described in the Yochum et al. patent, while perhaps an improvement over the prior art analog contact-type potentiometer system, has certain drawbacks and disadvantages. For example, the system requires a number of light-emitting elements and light-detecting elements, specifically 13 emitter/detector pairs, which will produce 13 digital signals whose values must be interfaced in order to provide a signal which corresponds to a value of the movable lever in any one of a number of positions (col. 7, lines 6–18).

In addition, the Yochum et al. patent does not disclose any means by which the lever may be automatically moved to a selected position, although this type of mechanism is well known in the audio fader prior art. In these devices, in further editing of an audio sequence, the fader lever or levers are caused to move to the position(s) the operator had adjusted them to during previous mixing or editing passes in order that the operator may visually observe the previous positioning(s) of the fader levers. This acts as a visual indication to the operator and assists him/her in adjusting and further editing the audio sequence. Thus, while the Yochum et al. patent broadly discloses an apparatus which may be seen as a logical extension from an analog audio fader to a digital audio fader, the apparatus described in the Yochum et al. patent has the disadvantages set forth above. What is desirable, therefore, is a system which is digitally-based, but has few parts, provides good tactile feedback to an operator, is accurate and allows for automatic movement of the fader lever knob.

SUMMARY OF THE INVENTION

Thus, it is a general object of the present invention to provide an apparatus for digitally indicating and altering the position of a movable member, in the preferred embodiment illustrated as an audio fader lever.

Furthermore, it is another object of the present invention to provide an improved apparatus for indicating the position of a fader lever using optical encoder technology for precision and to reduce wear characteristics present in prior art potentiometer-based systems.

It is yet another object of the present invention to provide an apparatus which does not materially degrade in operation or accuracy over time as compared to the prior art devices discussed above.

It is still another object of the present invention to provide a controllable motor system connected to the optical encoder-based fader of the present invention to automatically move the fader lever to previous editing pass positions.

In accordance with the present invention, an apparatus is provided for indicating the position of a movable member and more particularly a movable lever controlling a parameter in an audio or other control system. The apparatus includes a frame which supports the lever knob. The lever knob is constrained to move in one-dimensional linear space by a number of rails or other suitable members. The frame, which forms part of the present apparatus, also includes a rotary optical encoder of a type in which the amount and direction of rotation of the shaft of the optical encoder corresponds to the position of the lever within its constrained area of linear movement. The lever is attached to the optical encoder by a suitable taut wire, string or other elongated means so that linear movements of the lever are translated into rotational movements of the optical encoder.

In addition, a motor may be incorporated in and mechanically associated with the apparatus. The purpose of the motor is to automatically move the lever to the position(s) to which the operator previously set the slider during previous mixing or editing operations. Therefore, the position of the lever translates into a visual feedback-type indication to the operator, in an audio editing environment, of the amount of gain which was applied to a signal during previous audio mixing or editing operations or, more generally, to the changes in previous operations of the lever knob.

Finally, while the preferred embodiment utilizes the present invention in a digital audio apparatus, it has applications in other fields as well, including lighting applications, video editing applications, industrial processing equipment or any other apparatus which can utilize a variable, digitally-controlled signal and associated lever knob.

BRIEF DESCRIPTION OF THE DRAWINGS

The foregoing and other objects and advantages will become readily apparent from the detailed description below taken in conjunction with the accompanying drawing where:

FIG. 1 is a frontal view of a fader control in accordance with the disclosure of the present invention and illustrates the relative positioning of the motor, the lever and encoder.

DETAILED DESCRIPTION OF THE PREFERRED EMBODIMENT

FIG. 1 illustrates the preferred embodiment of the present apparatus. As seen in FIG. 1, a fader apparatus 10 includes a frame 12. Frame 12 is shown as having an upper frame portion 13 and two depending and extending end frame members 15 and 17. Frame members 15 and 17 support two rails 14 and 16. While two rails 14 and 16 are shown in FIG. 1, any number less than or more than the two rails shown may be utilized as desired. The main purpose of the rails is to constrain movement of lever body 18 to linear movements. Lever body 18 is shown as having a rectangular form (but may have any other suitable form). Rails 14 and 16 pass through apertures 8 and 9 in the lever body 18.

As shown in FIG. 1, the rails 14 and 16 are located one above the other within the frame 12. If desired, the rails may be located closer together, further apart or in a parallel side-by-side position as desired to support the lever body and constrain its movement to the translational directions shown by arrow 19 and thus prevent any movement in directions perpendicular to directions 19. The lever body 18 has lever knob 20 attached to it, shown for illustrative purposes only in a simple form. It is well-known in the art that a rounded or other shape knob may be utilized. The lever knob 20 rides within a slot 30 formed in the frame portion 13 of the fader apparatus 10. The slot acts to constrain movement of the lever knob 20 to the directions 19 and also serves to help prevent dirt or dust from entering into the area where the rails 14 and 16 and the lever body 18 are located. An optical encoder 22, which is shown as being of a rotary type, is attached to the fader apparatus 10 at one portion 15 of the frame 12. In the optical encoder of a rotary type illustrated, a pulley 25 is attached to the rotatable shaft of the encoder. The rotatable shaft conventionally has a rotatable code wheel or disc mounted thereon, a light source (which may be a LED) on one side of the code wheel or disc, a photo detection assembly on the other side of the code wheel or disc and signal processing circuitry. For each encoder rotation position in either direction of rotation, there is produced a differential binary output so that rotatable shaft position can be absolutely determined, based on the amount of light from the light source passing through the code wheel or disc to the photo detection assembly. The structure and operation of optical encoders is described in "Input/Output Devices", *Machine Design*, Jun. 1990, p. 389 et seq. While a number of different types of encoders may be utilized, one suitable optical encoder is Model RE20F which is available from the Copal Company of Japan.

In the present invention, the lever knob 20 is operatively connected to the optical encoder 22 such that movement of the knob will cause the pulley 25 attached to the shaft of the optical encoder 22 to rotate. As illustrated in FIG. 1, this is accomplished through the use of a taut string, wire or other elongated material 24 which is attached at 27 by suitable means (such as a screw, rivet or glue) to the lever knob 20 and is wrapped around the shaft of the pulley 25. A second pulley is also preferably used and a spring, elastic or other suitable means may be utilized to maintain the elongated material taut. This second pulley 29, shown mounted on a shaft, is located on the opposite side of the first pulley 25 from the lever knob 20. The string or other elongated material 24 is wrapped around the shaft of the pulley 29 as well. Thus, as can be seen in FIG. 1, movement of the lever knob in either of linear directions 19 will cause the pulley 25 to rotate due to the frictional interaction between the string 24 and the pulley 25. The amount of rotation is in proportion to the position of the lever knob 20 within the slot 30. Electrical cable 28 is connected between encoder 22, by suitable means well-known to those skilled in the art, to a computer apparatus 32. The circuit board 32 may be incorporated within or at least operatively connected to a computer 35, which itself may be contained within a known digital audio console. A number of digital audio consoles are commercially available. One such digital audio console is manufactured by the assignee of the present invention. The computer 35 may, however, be associated with any number of other non-audio devices, depending on the use to which the lever knob is put, such as in digitally controlling lighting, video editing or other processes. The circuit board 32 will receive and translate electrical signals generated from rotation of the pulley 25 of the optical encoder 22. The counts and direction of the counts are then translated into positional movements which indicate the position of the lever knob 20 within the slot 30. The translation of the signals will, in turn, be transformed into other analog or digital signals which will adjust any number of parameters, for example in the preferred embodiment, the gain on an audio signal operatively connected to the audio fader.

The functioning and operation of the circuit board 32 will now be discussed. Circuit board 32 includes a number of elements, including a programmable logic array (PAL) 50. PAL 50 accepts the electrical count signals from encoder 25 through cabling 28, and translates that digital information and forwards it to the microprocessor 52, which oversees the operation of signals form the PAL 50 and performs other processing and storing functions. A random access memory (RAM) 54 may be utilized to store operating programs for microprocessors 52 and store counts from encoder 22 and PAL 50. The purpose of the digital-to-analog converter (DAC) 56 will be explained below. The circuit board 32 is shown in FIG. 1 as being operatively connected to computer 35 which may be contained within or otherwise associated with a digital audio console.

Although a taut string or wire is shown in FIG. 1, other well-known means which translate lateral motion to rotational motion may be used, such as a rod attached to the lever knob 20 which will rub against and move the optical encoder pulley 25 or a gearing system using a circular gear on the pulley 25 and a lateral gear attached to the lever knob 20. Although a rotatable encoder has been illustrated and discussed, other type encoders, such as a linear encoder, may be utilized as well, and be attached to the taut string or wire by suitable means, not shown but well known in the art, which translate movement of the lever knob 20 to movement of a linear encoder. The pulley 29 may be free-standing or may, as shown in FIG. 1, be attached to motor 26. Motor 26, in turn, is attached through electrical cabling 34 to the digital audio console 32.

In audio mixing and editing operations, the operator may desire to view the position(s) of one or more levers during a previous editing or mixing operation as explained above. During the mixing or editing operation, the operator will move the lever knob 20 to effect, for example, a change in the audio gain of the signal which is associated with that particular lever knob. It is well understood that any number of lever knobs may be used to edit and mix any number of audio signals. The editing or mixing operation for a particular audio sequence connected with a particular lever knob may, through the use of the optical encoder disclosed above, be stored internal to or external to the audio console 32. The "replay" of a previous editing or mixing sequence causes movement of the lever knob, providing an important visual feedback to the operator of the previous adjustment(s) which had been made to an audio sequence.

To achieve this "replay" effect within the apparatus of the present invention, the motor 26 is described above (which is connected by cabling 34 to the circuit board 32) I activated, as described below. As mentioned earlier, the RAM 54 (or other suitable solid state or disk-based memory) stores a count of the position of the lever 20 position(s) prior to a "replay". When the operator desires the operator to "replay" a particular positioning of a particular lever knob, the operator causes, by well known means, the counts stores on circuit board 32 to be fed to the DAC 56 which will convert the digital signals to analog signals the motor 25 understands through cable 34. Upon commencement of "replay", the motor 26 will rotate the pulley 29 causing the slider knob to move within the slot 30, thus providing the operator with a visual indication of the previous audio editing operations through the use of the so-called "moving fader". An additional feature of the present invention is the provision of suitable means such that, when an operator touches the lever knob 20 during the "replay" operation just described, the lever knob may halt all further movement within the slot 30. This may subsequently cause the audio console 32 to override the previously recorded audio editing or mixing sequence, as is well known in the art. The means to stop the motor 26 may be accomplished in a number of ways, including, in a manner a well-known in the art, utilizing the microprocessor 52 to sense a change in capacitance in the apparatus of the present invention when an operator touches the lever. The capacitance change when an operator touches the lever is thus sensed by the microprocessor. This sensing is operable only in several automation modes well known in the art, including the "replay" mode, such that any touching of the lever knob would cause the motor 26 to shut down. In operation, a cable 58 in FIG. 1 is connected utilizing well known techniques between the lever knob 20 and PAL 50. Touching of the lever knob is sensed by the microprocessor 52, through cable 58 and PAL 50. This in turn causes microprocessor 52 to signal DAC 56 to turn off current flowing through cable 34 to motor 26. Other techniques, such as employing a known type of microswitch on the lever knob may also be utilized to cause motor 26 to be turned off. Other methods of achieving a halt of the movement of the lever knob are well known to those skilled in the art. While an electrical motor 26 has been described herein, it is to be understood that other means to achieve movement of the lever knob are feasible. These include linear or rotational electromagnetic coil actuators and other electrical, electromagnetic and electromechanical devices which convert a given amount of electrical current to movement of a shaft, arm or other mechanical actuator.

Thus, an improved fader design has been described above which does away with the noise and analog signal discrepancies which may occur in the use of the prior art potentiometer type fader systems while providing a simpler, more accurate, virtually noise-free digital-based system which allows the operator to accurately position and determine the degree of audio gain and other audio mixing parameters. It is more accurate and noise-free because it eliminates the mechanical wear which is present in conventional mechanically-based potentiometer designs. Furthermore, the lever and pulley design has been found by the inventor to provide a smoothness in operation and general good tactile "feedback" compared to prior art potentiometer designs, as well as being less expensive to manufacture. The good tactile "feel" and "feedback" of the apparatus of the present invention is important because good tactile feedback is very desirable for acceptance of the present invention by a professional operator. It provides a uniform amount of frictional resistance to movement of the control lever, yet is not too tight or too loose and does not "hang-up" as may be the case prior art systems. This aspect of the present invention was, to the inventor's knowledge, never addressed by the prior art devices.

Furthermore, while in the embodiment illustrated the optical fader apparatus is utilized to control audio signals, the apparatus of the present invention may be utilized to control other parameters and sources, such as light sources in a well known type of lighting console. In both audio and lighting consoles, a number of fader control levers, ranging from as few as 1 or 4 such levers to hundreds of levers (but generally in the range of 48–64 levers) may be utilized. The cost savings discussed above are multiplied by the number of levers utilized in a particular audio or lighting console. This is accomplished in an apparatus which is simple to construct and tends to virtually eliminate wear associated with prior art potentiometer-based fader systems.

Thus, other sources and parameters which may be controlled using the present invention include lighting controllers, industrial process controllers, video mixing consoles and other applications in which a potentiometer formerly served to control a changeable parameter.

Given the embodiments of the invention described herein, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention as defined by the appended claims.

What is claimed is:

1. Apparatus for indicating the position of a member with respect to another member, comprising:
   a frame member;
   a linearly movable member positionable and movable within the frame member;
   a digital encoding apparatus operatively connected to the frame member, the encoder being responsive to linear movement of the movable member to generate an electrical signal indicative of the degree of movement; and,
   means for connecting the movable member and the encoding apparatus, movement of the movable member causing movement of the encoding apparatus, whereby the amount and direction of movement of the encoder is related to the position of the movable member within the frame member.

2. The apparatus of claim 1, wherein the digital encoding apparatus is a rotatable apparatus, and wherein the amount and direction of rotation of the rotatable encoder is indicative of the position of the movable member within the frame member.

3. The apparatus of claim 2, in which the means for connecting is an elongated member attached to the movable member, the elongated member being in frictional engagement with a portion of the encoding apparatus, whereby movement of the movable member causes rotation of the encoding apparatus.

4. The apparatus of claim 3, wherein the elongated member is a string-like member attached to the movable member, the elongated member further being wrapped around a pulley attached to a rotatable shaft contained in the encoding apparatus, whereby movement of the movable member causes the pulley to rotate.

5. The apparatus of claim 1, wherein the encoding apparatus is an optical encoder.

6. The apparatus of claim 1, wherein the movable member digitally controls a parameter associated with a digital computing apparatus.

7. The apparatus of claim 1, wherein the movable member is an audio fader control lever and the apparatus is an apparatus to control the gain of an audio signal.

8. The apparatus of claim 1, wherein the frame member further comprises frame legs extending from opposite ends of the frame member, the movable member being movable within an elongated slot and having an extending block with at least one aperture formed therein, and at least one elongated shaft parallel to the elongated slot and extending from one frame leg to the other frame leg through the aperture of the extending block, whereby the movable member is constrained to move along the elongated shaft and within the elongated slot.

9. The apparatus of claim 3, further comprising an electrical motor operatively connected to the elongated frame, a source of electrical current for causing a shaft contained within the motor to rotate, and a pulley attached to the shaft, the string-like member being wrapped around the electrical motor pulley, such that when electrical current is applied to the motor under control of a digital computing apparatus, the shaft rotates, rotating the pulley and moving the movable member attached to the string-like member within the frame member and the pulley attached to the encoding apparatus.

10. The apparatus of claim 3, further comprising an electrically-controlled motivation means for moving the movable member, a source of electrical current for causing the motivation means to move, the motivation means being connected to the movable member, such that when current is applied to the motivation means, the movable member is moved by the motivation means.

11. The apparatus of claim 9, wherein the control apparatus is a digital computing apparatus.

12. The apparatus of claim 9, wherein the control apparatus is a digital audio apparatus.

13. The apparatus of claim 1, wherein the movable member further comprises a lever knob adapted for gripping by an operator to position the movable member within the frame member.

14. The apparatus of claim 1, further comprising an electrical conductor connected to the encoding apparatus, and wherein the encoding apparatus, upon rotation, sends an electrical signal on the electrical conductor to a digital computing apparatus operatively connected to the electrical conductor to produce an indication of the position of the movable member within the frame member.

15. The apparatus of claim 14, in which the digital computing apparatus includes a means for receiving and processing the electrical signal from the encoding apparatus.

16. The apparatus of claim 9, in which an electrical conductor is attached between the motor and a digital computing apparatus, the digital computing apparatus including a means for receiving and processing electrical signals from the encoding apparatus, further comprising means for causing the motor to rotate to move the movable member within the frame member.

17. The apparatus of claim 16, further comprising a means associated with the movable member for sensing touching by an operator, an electrical conductor connected to the means for sensing and to the digital computing apparatus, whereby sensing of touching causes the digital computing apparatus to activate a selected function.

18. The apparatus of claim 17, wherein sensing of touching of the movable member causes the digital computing apparatus to cause the motor to stop rotation, halting movement of the movable member.

19. The apparatus of claim 17, wherein the means for sensing include the operation of the digital computing apparatus to sense the change in capacitance when an operator touches the movable member.

20. Apparatus for indicating the position of one member with respect to another member, comprising:

a frame member and a movable member positionable and movable within the frame member;

a digital encoding apparatus operatively connected to the frame member, the encoder being responsive to movement of the movable member within the frame member to generate an electrical signal indicative of the degree of movement; and, means for connecting the movable member and the encoding apparatus, movement of the movable member causing movement of the encoding apparatus in which the amount of movement of the encoder is related to the position of the movable member within the frame member.

\* \* \* \* \*

UNITED STATES PATENT AND TRADEMARK OFFICE
CERTIFICATE OF CORRECTION

PATENT NO : 5,986,584
DATED : November 16, 1999
INVENTOR(S) : Neal E. Breitbarth It is certified that error appears in the above-identified patent and that said Letters Patent is hereby corrected as shown below:

Cover page, under "[56] References Cited", after "U.S. PATENT DOCUMENTS", should be inserted the following:

```
-- 3,363,106   1/1968   Park ............... 250/209
   3,381,288   4/1968   Van Vlodrop ........ 340/324
   3,619,626  11/1971   Rudolph ............ 250/219WD
   3,755,681   8/1973   Montross ........... 250/229
   3,835,384   9/1974   Liff ............... 325/25
   4,015,253   3/1977   Goldstein .......... 340/347P
   4,122,395  10/1978   Schotz et al. ...... 325/453
   4,137,451   1/1979   Einolf, Jr. ........ 250/231SE
   4,319,134   3/1982   Weber .............. 250/231SE
   4,412,182  10/1983   Yochum ............. 330/59
   4,573,110   2/1986   Drumm .............. 362/319
   4,887,903  12/1989   Frisco et al. ...... 356/372 --;
``` after "5,719,570  2/1998 Breitbarth ..... 341/13" should be inserted the following:

-- FOREIGN PATENT DOCUMENTS 2076602   12/1981   Great Britain . --.

Column 1, line 11, "a" (first occurrence) should be -- an --.

Column 2, line 28, after "following" should be inserted -- patents: --.

Column 6, line 15, "is" (first occurrence) should be -- as --;
         line 16, "I" should be -- is --;
         line 41, "a" (second occurrence) should be deleted.

UNITED STATES PATENT AND TRADEMARK OFFICE
CERTIFICATE OF CORRECTION

PATENT NO : 5,986,584

DATED : November 16, 1999

INVENTOR(S) : Neal E. Breitbarth

It is certified that error appears in the above-identified patent and that said Letters Patent is hereby corrected as shown below:

Column 7, line 22, after "case" should be inserted -- in --.

Claim 9, column 8, line 49, "digital computing" should be -- control --.

Signed and Sealed this

Twenty-fourth Day of October, 2000

Attest:

Q. TODD DICKINSON

*Attesting Officer*

*Director of Patents and Trademarks*